United States Patent [19]

Feldtkeller

[11] Patent Number: 5,017,802
[45] Date of Patent: May 21, 1991

[54] BASE CURRENT REGULATION CIRCUIT FOR A SWITCHING TRANSISTOR, IN PARTICULAR A BIPOLAR TRANSISTOR

[75] Inventor: Martin Feldtkeller, Munich, Fed. Rep. of Germany

[73] Assignee: Siemens Aktiengesellschaft, Berlin and Munich, Fed. Rep. of Germany

[21] Appl. No.: 261,046

[22] Filed: Oct. 21, 1988

[30] Foreign Application Priority Data

Oct. 26, 1987 [DE] Fed. Rep. of Germany ....... 3736182

[51] Int. Cl.$^5$ .......................... H03K 3/01; H03K 3/26
[52] U.S. Cl. ..................................... 307/270; 307/300; 307/263
[58] Field of Search ................ 307/300, 270, 263, 246, 307/254

[56] References Cited

U.S. PATENT DOCUMENTS

| | | | |
|---|---|---|---|
| 4,227,123 | 10/1980 | Deitz | 315/397 |
| 4,239,989 | 12/1980 | Brajder | 307/255 |
| 4,549,095 | 10/1985 | Stefani et al. | 307/300 |
| 4,645,945 | 2/1987 | de Sartre | 307/254 |
| 4,684,824 | 8/1987 | Moberg | 307/270 |

FOREIGN PATENT DOCUMENTS 0015091 8/1980 European Pat. Off.
0159233 10/1985 European Pat. Off.
2366746 4/1978 France.

OTHER PUBLICATIONS

R. B. Jarl, "Antisaturation design techniques improve transistor switching speed", 10/27/83, EDN, pp. 265–272.
R. L. Bonkowski, "Speeding-Up Bipolars", 12/6/84, Machine Design, p. 136.
W. Schultz, "Baker Clamps-Traditional Concepts Updated for Third Generation Power Transistors", Jul.-/Aug. 84, Powerconversion Int'l, pp. 40–45.

Primary Examiner—Timothy P. Callahan
Attorney, Agent, or Firm—Adel A. Ahmed

[57] ABSTRACT

When triggering a bipolar switching transistor the control current for switching on the bipolar switching transistor must be set properly. If the transistor is oversaturated, the switch-off time response is poor. With too low a control current, however, high forward losses occur. A method and circuit configuration for base current regulation of bipolar transistors in periodic switching operation is introduced. The method provides defining as a measure of the saturation of the switching transistor the base current time integral required for sweeping the base region of charge carriers, and setting as a function of this value the base current for switching on the switching transistor.

18 Claims, 2 Drawing Sheets

BASE CURRENT REGULATION CIRCUIT FOR A SWITCHING TRANSISTOR, IN PARTICULAR A BIPOLAR TRANSISTOR

The invention relates to a method and a circuit configuration for base current regulation of a switching transistor, in particular a bipolar transistor, which is impressed with a base current for switching-on, and whose base region, for switching-off, is swept of charge carriers.

If bipolar transistors are operated in periodic switching systems, such as, for example, switched mode power supplies, as electronic switches, i.e. as switching transistors, then, in the ideal case, they should have the following features:
1. high switching speed;
2. low output resistance in the switched-on state; and
3. very high output resistance in the switched-off state.

It is known that bipolar transistors have a lower output resistance in the switched-on state the stronger the bipolar transistor was driven into saturation during switch-on. Such an oversaturation operation, however, has the disadvantage that the maximum switching speed, which, in particular, is a function of the storage time of the bipolar transistor, is reduced. By storage time is meant that time during which the switching transistor still conducts without a base current flowing to maintain the conductivity.

The storage time can be shortened by reversing the base current, i.e. by sweeping the base zone of the bipolar transistor of charge carriers. On strong oversaturation, the transistor cannot be switched-off at any given speed by a correspondingly high clearing current, since the emitter current in the semiconductor body is pinched in and the collector-emitter voltage increases while the transistor has not yet reached its non-conducting state. If, however, the bipolar transistor is driven with too low a base current, then its forward power loss is increased.

A known circuit configuration for reducing the storage time of a bipolar transistor is the so-called Baker clamp drive circuit. The Baker clamp drive circuit is described, for example in EDN, Oct. 27, 1983, pages 265 to 272, and Machine Design, Dec. 6, 1984 on page 136. This known circuit configuration stabilizes the collector-emitter saturation voltage. As a rule, this circuit configuration contains, apart from the bipolar transistor, four diodes. The collector electrode of, for example, an npn bipolar transistor is, according to this known circuit configuration, connected to the cathode electrode of a first diode. The anode electrode of this first diode is connected to the cathode electrode of a second diode, whose anode electrode is connected to the base electrode of the npn bipolar transistor. Connected antiparallel to this second diode is the series circuit of two (optionally several) same-sense series diodes. The base current required for driving the npn bipolar transistor is supplied to the junction point of the first and the second diode.

The Baker clamp drive circuit supplies to the base electrode of the npn bipolar transistor only the drive current needed to maintain the collector-emitter voltage between approximately between 1.2 and 1.6 V. The pn junction between base and collector electrodes of the npn bipolar transistor remains reverse biased. Through the stabilization of the collector-emitter saturation voltage, the storage time of the npn bipolar transistor is reduced.

This Baker clamp drive circuit has the disadvantage that its resistance in the switched-on state is high. In addition, this circuit does not function well with inexpensive high voltage transistors.

A method is desirable for base current regulation of switching transistors, in particular bipolar transistors, for periodic switching operation, which, independently of the operating characteristic differences among units of the employed switching transistor, always provides quasi-saturation operation. By quasi-saturation operation is meant that the switching transistor is supplied with only as much base current for switching-on as is required for optimum switching response.

In accordance with principles of the present invention, a method for base current regulation of a switching transistor includes the following steps. Upon switching-off the switching transistor, the time integral of the base current, representing the swept-out storage charge, Q2 is defined as a measure for the saturation of the switching transistor. Dependent on the magnitude of this base current time integral (swept out charge) Q2, the base current for switching-on the switching transistor is set.

Apparatus in accordance with principles of the present invention comprises a switching transistor, in whose load path the series circuit of a load with a voltage source is connected. To the base terminal of the switching transistor a first terminal of a coupling capacitor and an output terminal of a base current source is connected. A control device is provided through which, to another connection of the coupling capacitor, current of positive or negative polarity is impressed, and through which the base current at the output of the base current source is settable depending on the charge of the coupling capacitor.

Figure 1:
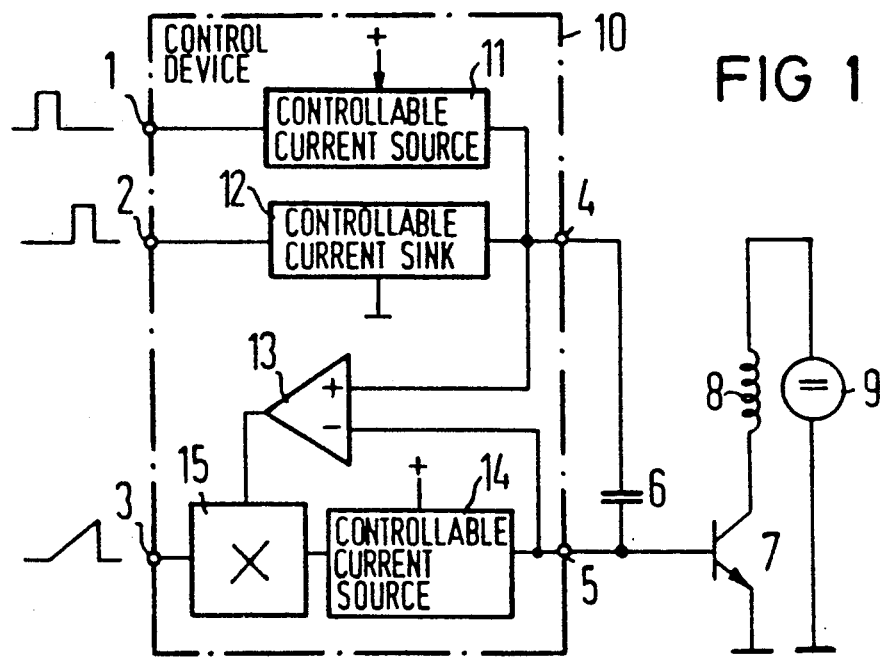
FIG. 1 is a block circuit diagram of apparatus for carrying out the method with a bipolar transistor.

The block circuit diagram shown in FIG. 1, of a circuit configuration according to the invention for carrying out the method for base current regulation, shows a control device 10 with a total of five terminals 1, 2, 3, 4, and 5. Between the terminals 4 and 5 a coupling capacitor 6 is connected. Simultaneously, to the terminal 5, the base electrode of a npn bipolar transistor 7 is connected whose load path is connected with the series circuit of a load 8 and a dc voltage source 9. The load 8 can be, for example, an inductive load, as is shown in FIG. 1.

The control device 10 has a first controllable current source 11, a controllable current sink 12, a difference amplifier 13, a second controllable current source 14 and a multiplier 15. An input terminal of the controllable current source 11 is connected to the terminal 1 of the control device 10, while an output terminal of the controllable current source 11 is connected to the terminal 4. The current sink 12 has its input terminal connected to the terminal 2 of the control device 10 and has its output terminal connected to the terminal 4. Terminal 4 is, furthermore, connected to a positive input terminal of the difference amplifier 13. The terminal 5 of the control device 10 is connected to a negative input terminal of the difference amplifier 13. An output terminal of difference amplifier 13 is connected to an input terminal of the multiplier 15 whose other input terminal is connected to the terminal 3 of the control device 10. An input terminal of the second controllable current source 14 is connected to an output terminal of the multiplier 15 and an output terminal of the controllable source 14 is connected to the terminal 5 of control device 10.

In operation it is provided, in this circuit configuration according to FIG. 1, to apply to the terminal 1 a trigger pulse for switching-on, and to the terminal 2 a trigger pulse for switching-off the switching transistor. If the terminal 1 receives a pulse of time duration tl, then the controllable current source 11 impresses, during this time tl, a current I1 on the terminal 4, and the base electrode of the switching transistor 7 receives, via the coupling capacitor 6 connected in series, a charge Q1. This magnitude of the charge Q1 is the product of time tl and current I1. The charge Q1 of the coupling capacitor 6 must be selected so that the switching transistor 7 is driven by it just into quasi-saturation. The charge of the coupling capacitor 6 increases simultaneously by Q1.

To switch off the switching transistor 7 a trigger pulse is present at the terminal 2, at least until the switching transistor 7 becomes completely nonconducting. The time interval from the beginning of this control pulse to the blocking of the switching transistor 7 is denoted below by t2. During this time t2, the controllable current sink 12 takes current I2 via terminal 4 from the coupling capacitor 6. Terminal 5 during time t2 is current-free so that the switching transistor 7 is swept out with current strength I2. The change quantity required for sweeping out is given by Q2=I2×t2. The charge in the coupling capacitor 6 is decreased by this charge quantity Q2.

The terminal 3 is intended to impress a control signal, preferably following the load current time curve of the switching transistor 7. This control signal, applied at the terminal 3, is multiplied by a value corresponding to the output voltage of the difference amplifier 13 and the result is supplied to the second current source 14 as control signal. The control current flowing from the current source 14 is supplied to the base electrode of the switching transistor 7 without influencing the charge of the capacitor 6. It functions to maintain the conductivity of the switching transistor 7 from the end of the trigger pulse at connection 1 to the beginning of the trigger pulse at terminal 2.

In connection with FIG. 2 the cooperation of the individual circuit components of the block circuit diagram represented in FIG. 1 will be explained in greater detail with reference to an embodiment.

In this embodiment, an inductive load 8 is assumed to be the load to be switched. At the terminal 3 is a sawtooth-shaped current, for example, following the load current time curve for an inductive load. The capacitor is charged through external wiring to a starting charge of Q0 at the beginning of the base current regulation process. Shortly before the control current starts to flow from the terminal 5, or simultaneously with it, the bipolar transistor 7 is driven into quasi-saturation with the charge Q1 via a corresponding trigger pulse at terminal 1. The switching transistor switches-on and the capacitor charge increases by Q1. Through the control current impressed on the switching transistor 7 via the second controllable current source 14, the state of quasi-saturation is just obtained, if the current amplitude has been set properly.

When the bipolar transistor 7 is to be switched-off, a corresponding trigger pulse is applied at terminal 2 whereby the controllable current sink 12 takes a current of magnitude I2 from terminal 4. This takes place until the bipolar transistor 7 is switched off. Thereby the charge in capacitor 6 is reduced by Q2.

When bipolar transistor 7 reaches the switched-off state, consequently, the following charge is in capacitor 6:

$$Q'0 = Q0 + Q1 - Q2. \tag{1}$$

A large charge Q2 suggests a strong saturation of the bipolar transistor, a small charge an undersaturation. The charge stored in the coupling capacitor 6 is directly proportional to the voltage present at the terminals of the coupling capacitor 6. The voltage present at the terminals of the coupling capacitor 6 is sensed via the difference amplifier 13. By means of the output signal from the difference amplifier 13, the amplitude of the control current flowing from terminal 5 can be varied. Thus, for example, for a strong saturation of the bipolar transistor 7 the output voltage of the difference amplifier 13 is reduced, and for undersaturation it is increased. A high voltage at the output terminal of the difference amplifier 13 indicates that the bipolar transistor 7 was operated in undersaturation and that the current amplitude for maintaining the quasi-saturation of the bipolar transistor 7 must be increased in order to achieve higher saturation. For sufficiently high switching speeds, instead of an amplitude modulation, a modulation of the duration of the control current flowing from current source 14 suffices.

Figure 2:
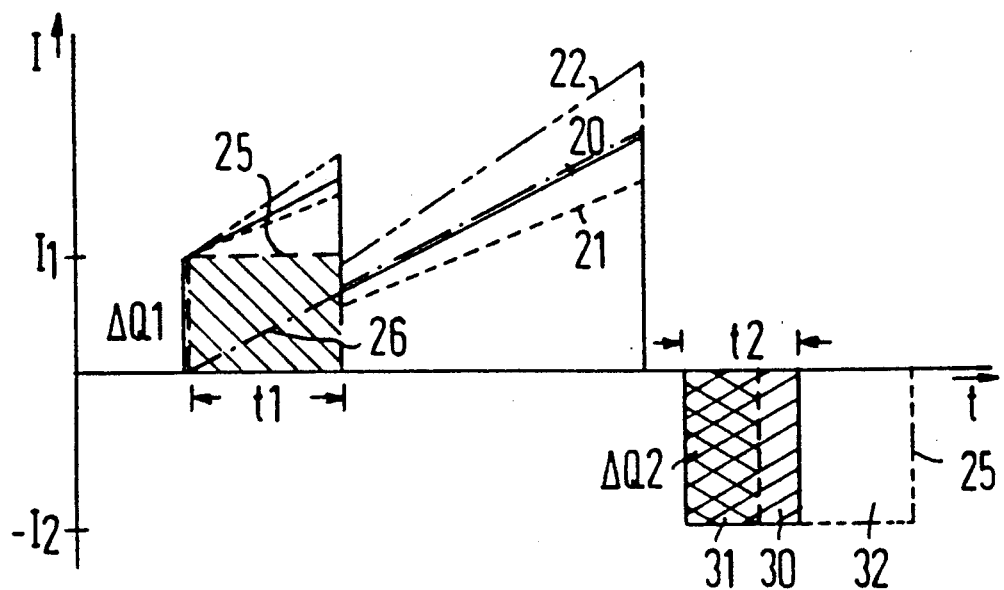
FIG. 2 is a time diagram of the base current at the npn bipolar transistor.

FIG. 2 is a current versus time diagram. Thus, the area bounded by any curve represents the magnitude of charge transferred. In FIG. 2 the particular charge Q2, that is the charge by which the charge in coupling capacitor 6 decreased upon switching off the bipolar transistor 7, is represented for strong saturation by area 32, for undersaturation by area 31, and quasi-saturation by area 30, which represents optimum operation. In addition, FIG. 2 shows different curves of the current required for maintaining the quasi-saturation of the bipolar transistor 7. These current curves are labeled with the reference numbers 20, 21, and 22. Current curve 20 denotes the resulting base current for quasi-saturation, curve 21 the base current for undersaturation, and curve 22 for oversaturation. Current curve 25 denotes the current from terminal 4 and curve 26 the current from terminal 5. Current curve 28 indicates the shape of the sweeping out current I2 during oversaturation operation.

If the bipolar transistor 7 is operated with, for example a high current amplitude, corresponding to current curve 22, then for the purpose of switching off the bipolar transistor 7 more charge, corresponding to area 32, must be swept out from its base region than at quasi-saturation. Corresponding to this long storage time, the coupling capacitor 6 is strongly discharged. The change in the coupling capacitor 6 decreases by the charge denoted by area 32 in FIG. 2. At the output of the difference amplifier 13, accordingly, a lesser voltage is present. This leads to a lesser current amplitude for the next switching cycle.

The current amplitude is preferably reregulated until the charge Q2 corresponds to the predetermined charge Q1. This ensures optimum driving of the bipolar transistor 7. A preferred further development of the invention, thus, provides that the re-gulating circuit sets the base current successively via several switching cycles until the base current time integral, representing the charge Q2 of the sweeping process, corresponds to a predetermined nominal value Q1.

Figure 3:
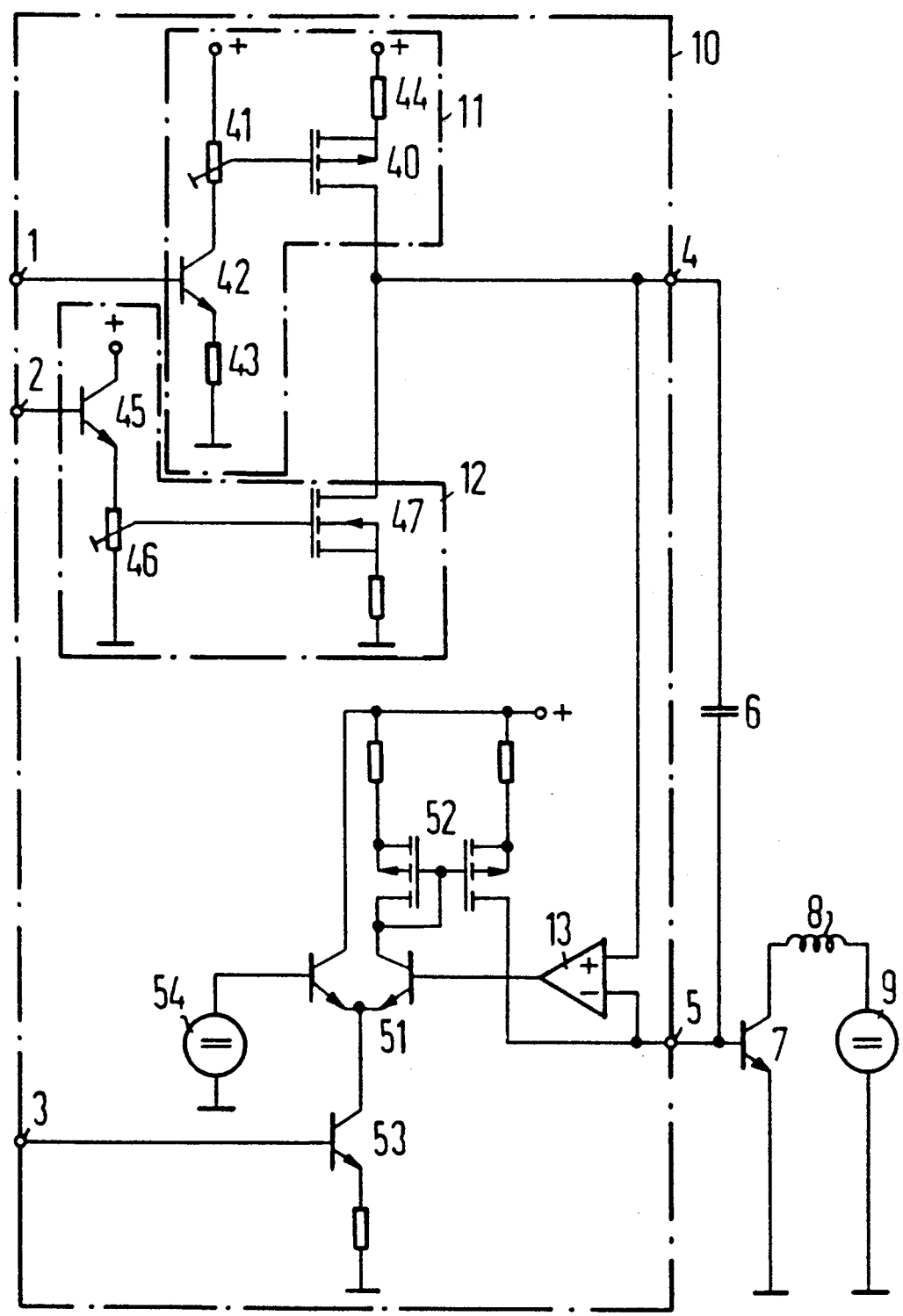
FIG. 3 is a schematic diagram of apparatus of FIG. 1.

In FIG. 3 a schematic diagram of an embodiment for the block circuit diagram according to FIG. 1 is represented. Identical reference numbers to those in FIG. 1 indicate identical elements. As first current source 11, for example, a p-channel enhancement-mode MOSFET 40 is provided having a gate electrode which is connected via a voltage divider 41 to a collector electrode of an npn-transistor 42. This npn transistor 42 is connected in a common emitter circuit with current feedback via resistor 43. By way of the voltage divider 41, the charge Q1, already explained in connection with FIGS. 1 and 2, can be set. A source electrode of MOSFET 40 is connected via a resistor 44 to a positive potential, while a drain electrode of the p-channel MOSFET 40 is connected to the output terminal 4 of the control device 10.

The controllable current sink 12 is realized by a emitter follower 45 with settable voltage divider 46 whose output ter minimal is connected to a gate electrode of a n-channel enhancement-mode MOSFET 47. The p-channel MOSFET 40 and the n-channel MOSFET 47 are arranged in a push-pull circuit with respect to each other. At the voltage divider 46 the sweeping current I2 can be set.

The output terminal of the difference amplifier 13, is connected to the base electrode of a first transistor of a transistor pair 51. The base electrode of a second transistor of a transistor pair 51 is connected to a dc voltage source 54. The transistor pair 51 has the function of a multiplier. Depending on the voltage between the two base electrodes, the current tapped off from the common emitter electrodes is distributed over the two collector currents. In the collector branch of the first transistor is the control path of a current mirror 52 consisting of two enhancement field effect transistors whose output terminal is connected to terminal 5 of the control device 10. The common emitter electrodes of the transistor pair 51 is connected to the collector electrode of transistor 53 which is connected in a common emitter circuit with current feedback. The base electrode of this transistor 53 is connected to terminal 3 of control device 10. The current flowing from current mirror to terminal 5 is, consequently, proportional to the product of a value derived from the voltage at terminal 3 and a difference voltage between the connections 4 and 5.

To improve the switching response it is provided to switch off the control current for driving the bipolar transistor 7 a few microseconds before the beginning of the sweeping process, thus, before the beginning of the switch-off of bipolar transistor 7. If the collector peak current is known and a function of, for example a regulating signal in a switched mode power supply, then keeping value Q1 proportional to the collector peak current improves the switching behavior over a wide regulating range.

Maintaining the sweeping current I2 with the instantaneously valid control current amplitude, decreases the switch-off losses over a large load range.

Of course, a pnp switching transistor can also be used, with the polarities needing to be changed in known manner.

The method according to the invention and the circuit configuration suggested for carrying out the method is suitable, in particular, for the direct driving of bipolar switching transistors through integrated circuits in periodic operating systems. Such periodic operating systems can be, for example, switching mode power supplies or ballast for fluorescent lamps.

What I claim is:

1. A method for regulating the base current of a switching transistor, in particular a bipolar transistor, comprising the following steps:

switching on the switching transistor by impressing a first predetermined base current on the control terminal of the switching transistor;

feeding a variable second base current to the control terminal, which maintains the switching transistor switched on for a predetermined time interval until the switching transistor switches off;

switching off the switching transistor by impressing a base current with a polarity opposite to that of the first and second base currents on the c control terminal of the switching transistor;

establishing a base current time integral $\Delta Q_2$ when switching off as a measure for the saturation of the switching transistor;

when the base current time integral $\Delta Q_2$ is relatively large, the second base current is reduced when the switching transistor is switched on again; and when the base current time integral $\Delta Q_2$ is relatively small, the second base current is increased when the switching transistor is switched on again.

2. A method according to claim 1, wherein the second base current is set so that the base current time integral $\Delta Q_2$ corresponds to a predetermined nominal value $\Delta Q_1$, with $\Delta Q_1$ derived as the base current time integral of the first base current.

3. A method according to claim 1, wherein the second base current follows a curve of a load current that can be tapped at the switching transistor.

4. A method according to claim 2, wherein the second base current follows a curve of a load current that can be tapped at the switching transistor.

5. A method according to claim 1, wherein the base current for the switching off of the switching transistor is set as a function of the current existing at the collector of the switching transistor.

6. A method according to claim 2, wherein the based current of the switching off of the switching transistor is set as a function of the current existing at the collector of the switching transistor.

7. A method according to claim 2, wherein the base current for the switching off of the switching transistor is set as a function of the current exiting at the collector of the switching transistor.

8. A method according to claim 1, wherein the second base current is switched off a few microseconds before the start of the base current for the switching off of the switching transistor.

9. A method according to claim 2, wherein the second base current is switched off of few microseconds before the start of the base current for the switching off of the switching transistor.

10. A method according to claim 3, wherein the second base current is switched off a few microseconds before the start of the base current for the switching off of the switching transistor.

11. A method according to claim 4, wherein the second base current is switched off a few microseconds before the start of the base current for the stitching off of the switching transistor.

12. A method according to claim 1, wherein the predetermined nominal value of $\Delta Q_1$ is maintained corresponding to a collector peak current of the switching transistor.

13. A method according to claim 2, wherein the predetermined nominal value of $\Delta Q_1$ is maintained corresponding to a collector peak current of the switching transistor.

14. A method according to claim 3, wherein the predetermined nominal value of $\Delta A_1$ is maintained corresponding to a collector peak current of the switching transistor.

15. A method according to claim 4, wherein the predetermined nominal value of $\Delta Q_1$ is maintained corresponding to a collector peak current of the switching transistor.

16. A method according to claim 5, wherein the predetermined nominal value of $\Delta Q_1$ is maintained corresponding to a collector peak current of the switching transistor.

17. A circuit arrangement for regulating the base current of a switching transistor comprising:

a control arrangement to drive a switching transistor, a first output terminal of the control arrangement being coupled to the base terminal of the switching transistor, a series connection of a load and a voltage source being coupled in a load path of the switching transistor, a coupling capacitor coupled between the gate terminal of the switching transistor and a second output terminal of the control arrangement;

the control arrangement being provided with means for switching on the switching transistor by impressing a first predetermined base current on its second output terminal, and feeding a variable second base current to h first output terminal, which maintains the switching transistor switched on for a predetermined time interval until the switching transistor switches off, and switching off the switching transistor by impressing a base current with a polarity opposite to hat of the first and second base currents on the second output terminal; and the control arrangement being provided with a difference amplifier whereon input terminal are coupled to the two output terminal of the control arrangement, and whereof the output controls the output current of a first current source, which current can be tapped at the first output terminal of the control arrangement, and having first, second and third input terminal for feeding input signals to said means and to the current source.

18. A circuit arrangement according to claim 17, wherein the means of the control arrangement include a second current source coupled between the first input terminal and the second output terminal, and a current sink between the second input terminal and the second output terminal, and wherein a multiplying device is provided which has one of tis inputs coupled to the third input terminal and its other input with the output of the difference amplifier, and in that the first current source is coupled between the first output terminal of the control arrangement and the output of the multiplier.

* * * * *